US009796892B2

(12) United States Patent
Yasuda et al.

(10) Patent No.: US 9,796,892 B2
(45) Date of Patent: Oct. 24, 2017

(54) SILICONE ADHESIVE COMPOSITION AND SOLID-STATE IMAGING DEVICE

(71) Applicant: Shin-Etsu Chemical Co., Ltd., Tokyo (JP)

(72) Inventors: Hiroyuki Yasuda, Annaka (JP); Kyoko Soga, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/035,845

(22) PCT Filed: Nov. 10, 2014

(86) PCT No.: PCT/JP2014/079692
§ 371 (c)(1),
(2) Date: May 11, 2016

(87) PCT Pub. No.: WO2015/072418
PCT Pub. Date: May 21, 2015

(65) Prior Publication Data
US 2016/0289519 A1    Oct. 6, 2016

(30) Foreign Application Priority Data

Nov. 12, 2013    (JP) ................................ 2013-233707

(51) Int. Cl.
| | |
|---|---|
| H01L 23/14 | (2006.01) |
| C09J 183/04 | (2006.01) |
| C08G 77/04 | (2006.01) |
| C08G 77/08 | (2006.01) |
| H01L 27/146 | (2006.01) |
| C08G 77/20 | (2006.01) |
| C08G 77/12 | (2006.01) |

(52) U.S. Cl.
CPC ............ *C09J 183/04* (2013.01); *C08G 77/04* (2013.01); *C08G 77/08* (2013.01); *H01L 23/14* (2013.01); *H01L 27/1462* (2013.01); *H01L 27/14618* (2013.01); *C08G 77/12* (2013.01); *C08G 77/20* (2013.01); *H01L 2224/0519* (2013.01); *H01L 2224/05599* (2013.01); *H01L 2224/2919* (2013.01)

(58) Field of Classification Search
USPC .................................................... 528/32, 40
See application file for complete search history.

(56) References Cited

U.S. PATENT DOCUMENTS

| 8,378,051 B2* | 2/2013 | Kashiwagi | ............... C08L 83/04 264/1.32 |
| 8,735,264 B2 | 5/2014 | Yasuda et al. | |
| 8,748,293 B2 | 6/2014 | Furuya et al. | |
| 8,889,810 B2 | 11/2014 | Takeda et al. | |
| 2003/0064305 A1 | 4/2003 | Ono et al. | |
| 2012/0175045 A1 | 7/2012 | Furuya et al. | |
| 2012/0184663 A1* | 7/2012 | Hamamoto | ............. C08L 83/04 524/500 |
| 2012/0276717 A1* | 11/2012 | Furuya | .................. C08G 77/04 438/459 |
| 2013/0089967 A1* | 4/2013 | Yasuda | .................. C09J 183/04 438/458 |
| 2013/0220687 A1* | 8/2013 | Tagami | ..................... C09J 7/00 174/259 |
| 2014/0342530 A1* | 11/2014 | Yasuda | .................. C09J 183/14 438/459 |

FOREIGN PATENT DOCUMENTS

| JP | 2002-351070 A | 12/2002 |
| JP | 2003-177528 A | 6/2003 |
| JP | 2003-253220 A | 9/2003 |
| JP | 2012-144616 A | 8/2012 |
| JP | 2012-188650 A | 10/2012 |
| JP | 2012-229333 A | 11/2012 |
| JP | 2013-82801 A | 5/2013 |
| JP | 2013-179135 A | 9/2013 |

OTHER PUBLICATIONS

International Search Report for PCT/JP2014/079692 dated Feb. 3, 2015.
Written Opinion of the International Searching Authority for PCT/JP2014/079692 (PCT/ISA/237) dated Feb. 3, 2015.

* cited by examiner

*Primary Examiner* — Marc Zimmer
(74) *Attorney, Agent, or Firm* — Birch, Stewart, Kolasch & Birch, LLP

(57) ABSTRACT

The purpose of the present invention is to provide an adhesive composition using a silicone polymer compound, which does not require exposure, baking and development processes for the production, thereby making the production cost low and making the productivity high, which has good characteristics such as good adhesiveness, good hermetic sealing properties after thermal curing and low moisture absorption that are required for adhesives, which provides a cured film having high reliabilities such as high heat resistance and high light resistance, and which is capable of suppressing warping of a bonded substrate after back grinding that is necessary in the three-dimensional mounting production. A silicone adhesive composition which contains: (A) an organopolysiloxane containing a non-aromatic saturated monovalent hydrocarbon group and an alkenyl group; (B) an organohydrogenpolysiloxane containing two or more SiH groups in each molecule in such an amount that the molar ratio of the SiH groups in the component (B) is 0.5-10 relative to the alkenyl groups in the component (A); and (C) an effective amount of a platinum-based catalyst.

6 Claims, No Drawings

SILICONE ADHESIVE COMPOSITION AND SOLID-STATE IMAGING DEVICE

TECHNICAL FIELD

This invention relates to a silicone adhesive composition having adhesion, heat resistance, chemical resistance, insulation and high transmittance, and suited for use in the bonding application between protective glass and a semiconductor device, especially between protective glass and a silicon substrate for a solid-state imaging device such as CCD or CMOS, and a solid-state imaging device.

BACKGROUND ART

Prior art package structures for CCD and CMOS image sensors rely, for protecting the sensor portion from foreign matter such as moisture and dust, on the method of bonding the structure to protective glass with a photo-curable photosensitive adhesive composition in liquid or film form which is applied by printing techniques, typically dispensing.

The formation of the adhesive layer by the photolithography process starts with the step of coating the photosensitive adhesive composition or disposing a photosensitive adhesive film on a silicon substrate or glass substrate to form a photosensitive adhesive layer. Next, the photosensitive adhesive layer is exposed, baked and developed before a protective glass substrate (silicon substrate) is placed in close contact with the adhesive layer. Heat and pressure are applied to establish a bond between the adhesive layer and the protective glass. This is followed by heat curing and dicing, obtaining a hollow structure package. As the photosensitive resin composition, there are known a photosensitive resin composition comprising an acrylic resin, a photo-polymerizable compound and a photo-polymerization initiator (Patent Document 1: JP-A 2002-351070), a photosensitive resin composition comprising a photosensitive modified epoxy resin, a photo-polymerization initiator, a diluent solvent, and a thermosetting compound (Patent Document 2: JP-A 2003-177528), and the like.

Also, an adhesive dry film comprising a polyimide resin, a curable compound and a silane coupling agent is disclosed as a mere thermosetting adhesive (Patent Document 3: JP-A 2003-253220).

However, the photosensitive resin compositions of Patent Documents 1 and 2 are insufficient in properties needed as adhesive including adhesion, hermetic seal after heat curing, and low hygroscopicity and have the drawbacks of high cost and low productivity because three steps of exposure, bake and development are essential for the manufacturing process. Also the thermosetting adhesive of Patent Document 3 is insufficient in such properties as adhesion, heat resistance and light resistance.

Further, the 3D packaging technology using through-silicon via (TSV) recently becomes the mainstream of CMOS image sensor manufacture. In the 3D package, the silicon substrate is bonded to protective glass via heat curing, after which the silicon substrate must be ground on the back surface until the silicon substrate is thinned to a thickness of 100 µm or less. At this point, it is important that the thin wafer can be ground without fissure, and a new problem arises that the bonded substrate is largely warped. The problem becomes outstanding particularly with a large diameter wafer of 8 inches or more.

An epoxy-containing thermosetting silicone polymer is disclosed in Patent Document 4: JP-A 2012-188650 as effective for suppressing the warpage of bonded substrate. Although the substrate bonded using this silicone composition is reduced in warpage, a problem arises that its spectroscopic properties are substantially degraded in a high-temperature/long-term heat resistance test (e.g., more than 50 hours). Similar silicone polymers are known from Patent Document 5: JP-A 2012-229333 and Patent Document 6: JP-A 2013-082801. They exhibit good bonding, heat resistance and back grinding, but fail to fully meet necessary properties as a permanent film because of thermoplastic nature.

PRIOR ART DOCUMENTS

Patent Documents

Patent Document 1: JP-A 2002-351070
Patent Document 2: JP-A 2003-177528
Patent Document 3: JP-A 2003-253220
Patent Document 4: JP-A 2012-188650
Patent Document 5: JP-A 2012-229333
Patent Document 6: JP-A 2013-082801

SUMMARY OF THE INVENTION

Problems to be Solved by the Invention

An object of the invention, which has been made under the above circumstances, is to provide a silicone adhesive composition of addition cure type based on a silicone polymer, which has advantages of low manufacture cost and high productivity because exposure, bake and development steps are unnecessary for the manufacture process, which has satisfactory properties needed as adhesive including adhesion, hermetic seal after heat curing, and low hygroscopicity, and forms a cured film with high reliability in terms of heat resistance and light resistance, and which can reduce the warpage of bonded substrate after back grinding as required in the 3D package manufacture.

Means for Solving the Problems

Making extensive investigations to attain the above object, the inventors have found that the silicone adhesive composition defined below is an excellent adhesive for use in the manufacture of CCD and CMOS image sensors. The invention is predicated on this finding.

Accordingly, the invention provides a silicone adhesive composition and solid-state imaging device as defined below.

[1] A silicone adhesive composition comprising
(A) an organopolysiloxane containing a non-aromatic saturated monovalent hydrocarbon group and an alkenyl group,
(B) an organohydrogenpolysiloxane containing at least two SiH groups per molecule in such an amount that a molar ratio of SiH groups in component (B) to alkenyl groups in component (A) may be in a range of 0.5/1 to 10/1, and
(C) an effective amount of a platinum-based catalyst,
said organopolysiloxane (A) containing a non-aromatic saturated monovalent hydrocarbon group is (A-1) an organopolysiloxane comprising the following units (I) to (III) and having a weight average molecular weight of 2,000 to 60,000, or (A-2) an organopolysiloxane having a weight average molecular weight of 20,000 to 400,000, obtained from hydrosilylation reaction of the organopolysiloxane (A-1) with at least one organohydrogenpolysiloxane having the general formula (1) in such amounts that a molar ratio of total SiH groups in the organohydrogenpolysiloxane to total alkenyl groups in the organopolysiloxane (A-1) may be in a range of 0.4/1 to 0.8/1, to achieve a molecular weight buildup, (I) 50 to 99 mol % of siloxane units (T units) of the formula: $R^1SiO_{3/2}$, (II) 0 to 49 mol % of siloxane units (D units) of the formula: $R^2R^3SiO_{2/2}$, and (III) 1 to 15 mol % of siloxane units (M units) of the formula: $R^4{}_3SiO_{1/2}$, wherein $R^1$ to $R^3$ each are a monovalent organic group, 2 to 10 mol % of the overall organic groups represented by $R^1$ to $R^3$ are alkenyl groups of 2 to 7 carbon atoms, at least 40 mol % of the overall organic groups represented by $R^1$ to $R^3$, which may be the same or different, are non-aromatic saturated monovalent hydrocarbon groups of 5 to 10 carbon atoms containing any one of the following cyclic structures:

[Chemical Formula 1]

and 10 to 40 mol % of the overall organic groups represented by $R^1$ to $R^3$, which may be the same or different, are substituted or unsubstituted, acyclic saturated monovalent hydrocarbon groups of 6 to 15 carbon atoms, and the balance being organic groups other than the alkenyl groups, the non-aromatic saturated monovalent hydrocarbon groups of 5 to 10 carbon atoms, and the acyclic saturated monovalent hydrocarbon groups of 6 to 15 carbon atoms, and $R^4$ may be the same or different and is a substituted or unsubstituted monovalent hydrocarbon group of 1 to 7 carbon atoms,

[Chemical Formula 2]

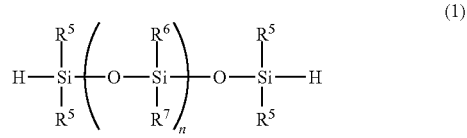

(1)

wherein $R^5$ to $R^7$ may be the same or different and are monovalent hydrocarbon groups of 1 to 12 carbon atoms, exclusive of alkenyl, and n is an integer of 0 to 200.

[2] The adhesive composition of [1], further comprising (D) a reaction inhibitor.

[3] The adhesive composition of [1] or [2], further comprising (E) an antioxidant.

[4] The adhesive composition of any one of [1] to [3], further comprising (F) an organic solvent.

[5] The adhesive composition of [4] wherein the organic solvent (F) is a hydrocarbon solvent having a boiling point of 120 to 240° C.

[6] The adhesive composition of any one of [1] to [5], which is sandwiched between a protective glass substrate and a substrate which is selected from the group consisting of a silicon wafer, solid-state imaging device silicon wafer, plastic substrate, ceramic substrate, and metallic circuit substrate.

[7] A solid-state imaging device comprising a laminate including a substrate which is selected from the group consisting of a silicon wafer, solid-state imaging device silicon wafer, plastic substrate, ceramic substrate, and metallic circuit substrate, on which a cured layer of the adhesive composition of any one of [1] to [5], and a protective glass substrate are stacked in order.

Advantageous Effects of the Invention

The silicone adhesive composition of the invention has advantages of low manufacture cost and high productivity because exposure, bake and development steps are unnecessary for the manufacture process, has satisfactory properties needed as adhesive including adhesion, hermetic seal after heat curing, and low hygroscopicity, and forms a cured film with high reliability in terms of heat resistance and light resistance, and can reduce the warpage of bonded substrate after back grinding as required in the 3D package manufacture. The composition is suited for use in the manufacture of CCD and CMOS image sensors.

EMBODIMENT FOR CARRYING OUT THE INVENTION

The silicone adhesive composition of the invention is described below in detail, but the invention is not limited thereto.

<Silicone Adhesive Composition>

The silicone adhesive composition of the invention is characterized by comprising:

(A) 100 parts by weight of an organopolysiloxane containing a non-aromatic saturated monovalent hydrocarbon group and an alkenyl group, (B) an organohydrogenpolysiloxane containing at least two SiH groups per molecule in such an amount that a molar ratio of SiH groups in component (B) to alkenyl groups in component (A) may be in a range of 0.5/1 to 10/i, and (C) an effective amount of a platinum-based catalyst.

[Component (A)]

Component (A) is an organopolysiloxane containing a non-aromatic saturated monovalent hydrocarbon group and an alkenyl group. In the adhesive composition, the organopolysiloxane may be used alone or in admixture of two or more. The preferred organopolysiloxane used herein is generally divided into the following two components (A-1) and (A-2), which are described in order.

Organopolysiloxane (A-1)

Organopolysiloxane (A-1) is an organopolysiloxane containing a non-aromatic saturated monovalent hydrocarbon group and an alkenyl group, comprising the following units (I) to (III) and having a weight average molecular weight (Mw) of 2,000 to 60,000 as measured by gel permeation chromatography (GPC) versus polystyrene standards, (I) 50 to 99 mol % of siloxane units (T units) of the formula: $R^1SiO_{3/2}$, (II) 0 to 49 mol % of siloxane units (D units) of the formula: $R^2R^3SiO_{2/2}$, and (III) 1 to 15 mol % of siloxane units (M units) of the formula: $R^4{}_3SiO_{1/2}$.

In units (I) to (III), $R^1$ to $R^4$ each are a monovalent organic group. The monovalent organic group is selected from the following groups (i) to (iv).

(i) non-aromatic saturated monovalent hydrocarbon groups of 5 to 10 carbon atoms containing a cyclic structure, i.e., non-aromatic saturated monovalent hydrocarbon groups of 5 to 10 carbon atoms, especially 5 to 7 carbon atoms, containing any one of the following mono- and/or divalent cyclopentyl structure, cyclohexyl structure, bicyclo[2.2.1] structure, and bicyclo[3.1.1] structure:

[Chemical Formula 3]

for example, such as cyclopentyl, cyclohexyl, norbornyl, norbornylethyl, and adamantyl.

(ii) substituted (specifically halo-substituted) or unsubstituted, acyclic saturated monovalent hydrocarbon groups of 6 to 15 carbon atoms, for example, such as n-hexyl, octyl, n-decyl, and n-dodecyl, with n-hexyl and n-dodecyl being preferred.

(iii) alkenyl groups of 2 to 7 carbon atoms, for example, such as vinyl, allyl, butenyl, hexenyl, cyclohexenyl, and norbornenyl, with vinyl being preferred.

(iv) substituted (specifically halo-substituted) or unsubstituted, monovalent hydrocarbon groups of 1 to 7 carbon atoms, for example, alkyl groups such as methyl, ethyl, propyl, butyl, and pentyl, aryl groups such as phenyl and tolyl, aralkyl groups such as benzyl, and haloalkyl groups such as chloromethyl, 3-chloropropyl, and 3,3,3-trifluoropropyl, with methyl, propyl and phenyl being preferred.

Herein, the content of cyclic structure-containing non-aromatic saturated monovalent hydrocarbon groups (i.e., non-aromatic cyclic saturated monovalent hydrocarbon groups (i)) is important for gaining chemical resistance. The content of non-aromatic cyclic saturated monovalent hydrocarbon groups is preferably at least 40 mol %, more preferably 50 to 80 mol % of the groups $R^1$ to $R^3$. A content of at least 40 mol % ensures heat resistance and light resistance.

Also the content of acyclic saturated monovalent hydrocarbon groups (ii) is important for improving the adhesion of polysiloxane. The content of substituted or unsubstituted, acyclic saturated monovalent hydrocarbon groups of 6 to 15 carbon atoms is preferably 10 to 40 mol % of the groups $R^1$ to $R^3$. With a content of at least 10 mol %, an improvement in adhesion is expectable. With a content of up to 40 mol %, a cured film does not become too flexible and has an appropriate hardness.

Preferably, 2 to 10 mol % of the overall organic groups represented by $R^1$ to $R^3$ are $C_3$-$C_7$ alkenyl groups (iii), with 4 to 8 mol % being most preferred. From a content of at least 2 mol %, it is expectable that a sufficient crosslinking density is reached in the curing step. With a content of up to 10 mol %, a cured film does not become too hard and has an appropriate hardness.

When the total of $R^1$ to $R^3$ does not reach 100 mol %, the balance is group (iv). $R^4$ is also group (iv) although it is acceptable that $R^4$ contains groups (i) to (iii).

As described above, the organopolysiloxane (A-1) which is preferred as the non-aromatic saturated monovalent hydrocarbon group-containing organopolysiloxane or component (A) contains 50 to 99 mol % of T units, 0 to 49 mol % of D units, and 1 to 15 mol % of M units.

Of the non-aromatic saturated monovalent hydrocarbon group-containing organopolysiloxane as component (A-1), an organopolysiloxane which is solid at a temperature of not higher than 40° C. is preferable from the handling aspect.

When the non-aromatic saturated monovalent hydrocarbon group-containing organopolysiloxane as component (A) contains 50 to 99 mol %, preferably 55 to 90 mol %, and more preferably 60 to 85 mol % of T units, it tends to be solid at 40° C. or lower and is suited for bonding between substrates.

When the non-aromatic saturated monovalent hydrocarbon group-containing organopolysiloxane as component (A) contains up to 49 mol %, preferably up to 45 mol %, and more preferably up to 40 mol % of D units, it tends to be solid at 40° C. or lower and when used in an adhesive composition, is effective to establish a bond between substrates.

It is also preferred from the aspect of thermal stability (to be described later) that in the non-aromatic saturated monovalent hydrocarbon group-containing organopolysiloxane as component (A-1), no reactive end groups, i.e., no silanol groups be left. Thus a structure having M units introduced at the end is preferred. The content of M units is preferably at least 1 mol %, more preferably 1 to 15 mol %, and even more preferably 3 to 10 mol %.

When the non-aromatic saturated monovalent hydrocarbon group-containing organopolysiloxane as component (A-1) contains 1 to 15 mol % of M units, it takes a structure having a fully reduced content of reactive end groups. A content of at least 1 mol % leads to a structure having a fully reduced content of reactive end groups such as silanol groups. A content of up to 15 mol % is adequate because the risk that the molecular weight becomes relatively low due to an excess of end groups is eliminated.

Where molecular end groups not capped with M units, that is, silanol or similar groups are present, it is preferred that the content of such reactive end groups be as low as possible. As long as the content of end residues such as silanol groups in the molecule is low, advantageously heat resistance is improved in that upon heat application, it is possible to prevent water from forming due to condensation reaction to become a cause of outgassing. Also preferably, the total content of silanol OH groups is up to 5%, more preferably up to 3% by weight of the overall resin solid. By introducing M units, the content of such reactive end groups can be reduced to the desired level.

The organopolysiloxane of the above-mentioned structure may be prepared by conducting hydrolysis and condensation reactions of a starting hydrolyzable silane or silanes in a controlled manner.

Examples of the hydrolyzable silane which can be used as the starting reactant include methyltrichlorosilane, phenyltrichlorosilane, n-propyltrichlorosilane, isopropyltrichlorosilane, n-butyltrichlorosilane, isobutyltrichlorosilane, n-pentyltrichlorosilane, isopentyltrichlorosilane, n-hexyltrichlorosilane, cyclohexyltrichlorosilane, n-octyltrichlorosilane, n-decyltrichlorosilane, n-dodecyltrichlorosilane, bicyclo[2.2.1]heptyltrichlorosilane shown below as (C1), bicyclo[2.2.1]nonyltrichlorosilane shown below as (C2), dimethyldichlorosilane, n-propylmethyldichlorosilane, isopropylmethyldichlorosilane, n-butylmethyldichlorosilane, isobutylmethyldichlorosilane, n-hexylmethyldichlorosilane, n-octylmethyldichlorosilane, n-decylmethyldichlorosilane, n-dodecylmethyldichlorosilane, cyclohexylmethyldichlorosilane, diphenyldichlorosilane, bicyclo[2.2.1]heptylmethyldichlorosilane shown below as (C3), bicyclo[2.2.1]nonylmethyldichlorosilane shown below as (C4), and analogues in which the hydrolyzable group is methoxy or ethoxy.

For the silane (C1) to (C4) having a plurality of cyclic structures, there exist stereoisomers, endo and exo forms, although it can be used regardless of isomerism.

[Chemical Formula 4]

 (C1)

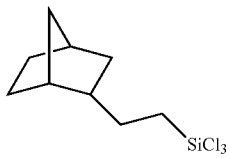 (C2)

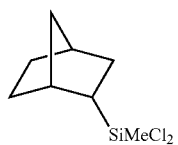 (C3)

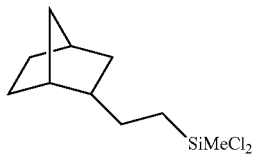 (C4)

Me stands for methyl.

The molecular weight distribution of the non-aromatic saturated monovalent hydrocarbon group-containing organopolysiloxane as component (A) is crucial. Specifically, it should preferably have a weight average molecular weight of at least 2,000 as measured by gel permeation chromatography (GPC) in accordance with the calibration curve plotted from polystyrene standards. As long as the weight average molecular weight of the non-aromatic saturated monovalent hydrocarbon group-containing organopolysiloxane is at least 2,000, it forms a film having a satisfactory strength after curing. As long as the weight average molecular weight is up to 60,000, a non-aromatic saturated monovalent hydrocarbon group-containing organopolysiloxane having a desired molecular weight can be synthesized in a reproducible and consistent manner. More preferably the weight average molecular weight of the non-aromatic saturated monovalent hydrocarbon group-containing organopolysiloxane is in a range of about 3,000 to about 50,000, and even more preferably in a range of about 5,000 to about 30,000.

As the GPC system capable of such analysis and determination, systems HLC-8120GPC, HLC-8220GPC, and HLC-8230GPC by Tosoh Corp. may be used (the same applies hereinafter).

Organopolysiloxane (A-2)

Organopolysiloxane (A-2) is a higher molecular weight one obtained by starting with the organopolysiloxane (A-1).

Specifically, it is an organopolysiloxane having a weight average molecular weight of 20,000 to 400,000, obtained from hydrosilylation reaction of the organopolysiloxane (A-1) with at least one organohydrogenpolysiloxane having the general formula (1):

[Chemical Formula 5]

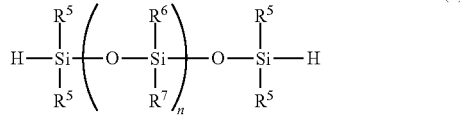 (1)

wherein $R^5$ to $R^7$ are each independently a $C_1$-$C_{12}$ monovalent hydrocarbon group exclusive of alkenyl, and n is an integer of 0 to 200, in such amounts that the total amount of SiH groups in the organohydrogenpolysiloxane is 0.4 to 0.8 time the total amount of alkenyl groups in the alkenyl-containing organopolysiloxane (A-1), in the presence of a platinum-based catalyst.

The total amount of SiH groups in component of formula (1) is preferably 0.4 to 0.8 time the total amount of alkenyl groups in component (A-1). When the ratio is at least 0.4, a sufficient molecular weight buildup is achieved, and resin strength is increased. When the ratio is up to 0.8, the adhesive composition can be cured via crosslinking reaction.

Examples of the $C_1$-$C_{12}$ monovalent hydrocarbon group exclusive of alkenyl, represented by $R^5$ to $R^7$, include alkyl groups such as methyl, propyl, hexyl, cyclohexyl, decyl and dodecyl, and aryl groups such as phenyl. In particular, methyl, cyclohexyl and phenyl are preferred.

In the organohydrogenpolysiloxane of formula (1), n indicative of a degree of polymerization is an integer of 0 to 200, preferably 20 to 150, and more preferably 40 to 120. As long as n is up to 200, satisfactory reaction takes place during synthesis without the risk of retarding hydrosilylation reaction with alkenyl groups on the alkenyl-containing organopolysiloxane (A-1), and the adhesion of the cured organopolysiloxane to the silicon substrate is good.

As long as n is in the range, addition reaction can be conducted using different organohydrogenpolysiloxanes.

[Preparation of Higher Molecular Weight Organopolysiloxane]

The reaction of alkenyl-containing organopolysiloxane (A-1) with organohydrogenpolysiloxane (1) may be carried out, for example, by dissolving alkenyl-containing organopolysiloxane (A-1) in an organic solvent, adding a platinum-based metal catalyst as a hydrosilylation catalyst, and adding dropwise organohydrogenpolysiloxane (1) to the solution while heating at 50 to 150° C. There is obtained an organopolysiloxane with a higher molecular weight.

The platinum-based catalyst is a catalyst for promoting hydrosilylation reaction with SiH groups. Suitable addition reaction catalysts are platinum group metal catalysts including platinum-based catalysts such as platinum black, platinic chloride, chloroplatinic acid, reaction products of chloroplatinic acid with monohydric alcohols, complexes of chloroplatinic acid with olefins, and platinum bisacetoacetate, palladium-based catalysts, and rhodium-based catalysts. The amount of the addition reaction catalyst used may be a catalytic amount although the catalyst is preferably added in an amount to give about 1 to about 800 ppm, especially about 2 to about 300 ppm of platinum group metal based on the weight of component (A-1).

The molecular weight of the organopolysiloxane at the end of hydrosilylation or addition reaction has an impact on properties of the adhesive composition, especially thermal deformation upon heating and void formation at the bond interface.

The higher molecular weight organopolysiloxane after addition reaction preferably has a weight average molecular weight (Mw) of 20,000 to 400,000 as measured by gel permeation chromatography (GPC) in accordance with the calibration curve plotted from polystyrene standards. As long as the weight average molecular weight is in the range, the organopolysiloxane has improved heat resistance and is free of voids. The weight average molecular weight is more preferably in a range of about 25,000 to about 300,000, even more preferably in a range of about 30,000 to about 150,000.

[Component (B)]

Component (B) is a crosslinker. It is an organohydrogenpolysiloxane containing at least two, preferably at least three SiH groups per molecule, which may be straight, branched or cyclic. The number of SiH groups per molecule is preferably up to 20.

Examples of component (B) include organohydrogenpolysiloxanes of the general formulae (2) and (3), but are not limited thereto.

[Chemical Formula 6]

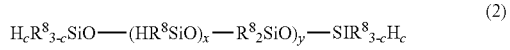

(2)

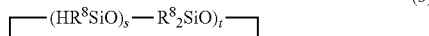

(3)

Herein $R^8$ is each independently a monovalent hydrocarbon group of 1 to 10 carbon atoms, especially 1 to 7 carbon atoms, such as alkyl, aryl or aralkyl group, preferably free of aliphatic unsaturation such as alkenyl; c is 0 or 1; x and y are integers, $2c+x \geq 2$, and x+y is such an integer that the organohydrogenpolysiloxane of formula (2) may have a viscosity of 1 to 5,000 mPa·s at 25° C., preferably $x+y \geq 4$, more preferably $200 \geq x+y \geq 4$; s is an integer of at least 2, t is an integer of at least 0, and s+t 3, preferably $8 \geq s+t \geq 3$.

The organohydrogenpolysiloxane as component (B) should preferably have a viscosity of 1 to 5,000 mPa·s, more preferably 1 to 2,000 mPa·s, and even more preferably 5 to 500 mPa·s as measured at 25° C. by a rotational viscometer. The organohydrogenpolysiloxane may be a mixture of two or more.

Component (B) is used in such an amount that a molar ratio of SiH groups in component (B) to alkenyl groups in component (A) (SiH/alkenyl) may be in a range from 0.5/1 to 10/1, especially from 1/1 to 5/1. As long as the SiH/alkenyl molar ratio is at least 0.5, problems like a lowering of crosslinking density and undercure of the composition do not arise. As long as the SiH/alkenyl molar ratio is up to 10, advantageously an excessive increase of crosslinking density is avoided and bubbling caused by residual SiH groups in a heat resistance test after bonding is suppressed.

[Component (C)]

Component (C) is a platinum-based catalyst, i.e., platinum group metal catalyst. Examples include chloroplatinic acid, alcohol solutions of chloroplatinic acid, reaction products of chloroplatinic acid with alcohols, reaction products of chloroplatinic acid with olefins, and reaction products of chloroplatinic acid with vinyl-containing siloxanes.

The amount of component (C) added is an effective amount, preferably 1 to 5,000 ppm, more preferably 5 to 2,000 ppm of platinum value (weight basis) based on the total of components (A) and (B). With an amount of at least 1 ppm, the silicone adhesive composition does not lose curability and crosslinking density does not lower. With an amount of up to 5,000 ppm, storage stability is good.

In addition to the above components (A), (B), and (C), the silicone adhesive composition of the invention may further comprise components (D), (E), (F) and other components.

[Component (D)]

Component (D) is a reaction inhibitor, which is optionally added, if necessary, when the silicone adhesive composition is prepared or coated onto a substrate, for preventing the treating solution from viscosity buildup or gelation prior to heat curing.

Examples of the inhibitor include 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane, with 1-ethynylcyclohexanol and 3-methyl-1-butyn-3-ol being preferred.

An appropriate amount of component (D) added is generally in the range of 0 to 8.0 parts by weight, preferably 0.01 to 8.0 parts by weight, and especially 0.05 to 2.0 parts by weight per 100 parts by weight of components (A) and (B) combined. As long as the amount is up to 8.0 parts by weight, the silicone adhesive composition does not lose curability. At least 0.01 part by weight of component (D) is sufficient to exert a reaction inhibiting effect.

[Component (E)]

In the inventive composition, an antioxidant may be blended as component (E) for improving thermal stability.

The antioxidant as component (E) is preferably at least one compound selected from the group consisting of hindered phenol compounds, hindered amine compounds, organophosphorus compounds, and organosulfur compounds.

Hindered Phenol Compounds:

Although the hindered phenol compounds used herein are not particularly limited, the hindered phenol compounds listed below are preferred.

1,3,5-trimethyl-2,4,6-tris(3,5-di-t-butyl-4-hydroxybenzyl) benzene (trade name: IRGANOX 1330), 2,6-di-t-butyl-4-methylphenol (trade name: Sumilizer BHT), 2,5-di-t-butylhydroquinone (trade name: Nocrac NS-7), 2,6-di-t-butyl-4-ethylphenol (trade name: Nocrac M-17), 2,5-di-t-amylhydroquinone (trade name: Nocrac DAH), 2,2'-methylenebis(4-methyl-6-t-butylphenol) (trade name: Nocrac NS-6), 3,5-di-t-butyl-4-hydroxybenzyl phosphonate diethyl ester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4,4'-butylidenebis(3-methyl-6-t-butylphenol) (Adeka Stab AO-40), 2-t-butyl-6-(3-t-butyl-2-hydroxy-5-methylbenzyl)-4-methyl-phenyl acrylate (trade name: Sumilizer GM), 2-[1-(2-hydroxy-3,5-di-t-pentylphenyl)ethyl]-4,6-di-t-pentylphenyl acrylate (trade name: Sumilizer GS), 2,2'-methylenebis[4-methyl-6-(α-methylcyclohexyl)phenol], 4,4'-methylenebis(2,6-di-t-butylphenol) (trade name: Seenox 226M), 4,6-bis(octylthiomethyl)-o-cresol (trade name: IRGANOX 1520L),
2,2'-ethylenebis(4,6-di-t-butylphenol),
octadecyl 3-(3,5-di-t-butyl-4-hydroxyphenyl)propionate (trade name: IRGANOX 1076),
1,1,3-tris(2-methyl-4-hydroxy-5-t-butylphenyl)butane (trade name: Adeka Stab AO-30),
tetrakis[methylene-(3,5-di-t-butyl-4-hydroxyhydrocinnamate)]-methane (trade name: Adeka Stab AO-60),
triethylene glycol bis[3-(3-t-butyl-5-methyl-4-hydroxy-phenyl)propionate] (trade name: IRGANOX 245),
2,4-bis(n-octylthio)-6-(4-hydroxy-3,5-di-t-butylanilino)-1,3,5-triazine (trade name: IRGANOX 565),
N,N'-hexamethylenebis(3,5-di-t-butyl-4-hydroxyhydrocinnamide) (trade name: IRGANOX 1098),
1,6-hexanediol-bis[3-(3,5-di-t-butyl-4-hydroxyphenyl)-propionate] (trade name: IRGANOX 259),
2,2-thio-diethylenebis[3-(3,5-di-t-butyl-4-hydroxyphenyl)-propionate] (trade name: IRGANOX 1035),
3,9-bis[2-[3-(3-t-butyl-4-hydroxy-5-methylphenyl)propionyl-oxy]-1,1-dimethylethyl] 2,4,8,10-tetraoxaspiro[5.5]undecane (trade name: Sumilizer GA-80),
tris(3,5-di-t-butyl-4-hydroxybenzyl) isocyanurate (trade name: IRGANOX 3114),
bis(ethyl 3,5-di-t-butyl-4-hydroxybenzylphosphonate) calcium/polyethylene wax 50/50 mixture (trade name: IRGANOX 1425WL),
isooctyl 3-(3,5-di-t-butyl-4-hydroxyphenyl)propionate (trade name: IRGANOX 1135),
4,4'-thiobis(6-t-butyl-3-methylphenol) (trade name: Sumilizer WX-R),
6-[3-(3-t-butyl-4-hydroxy-5-methylphenyl)propoxy]-2,4,8,10-tetra-t-butyldibenzo[d,f][1,3,2]dioxaphosphepin (trade name: Sumilizer GP), etc.

Hindered Amine Compounds:
Although the hindered amine compounds used herein are not particularly limited, the hindered amine compounds listed below are preferred.
p,p'-dioctyldiphenylamine (trade name: IRGANOX 5057),
phenyl-α-naphthylamine (Nocrac PA),
poly(2,2,4-trimethyl-1,2-dihydroquinoline) (trade name: Nocrac 224, 224-S),
6-ethoxy-2,2,4-trimethyl-1,2-dihydroquinoline (trade name: Nocrac AW),
N,N'-diphenyl-p-phenylenediamine (trade name: Nocrac DP),
N,N'-di-β-naphthyl-p-phenylenediamine (trade name: Nocrac White),
N-phenyl-N'-isopropyl-p-phenylenediamine (trade name: Nocrac 810NA),
N,N'-diallyl-p-phenylenediamine (trade name: Nonflex TP),
4,4'-(α,α-dimethylbenzyl)diphenylamine (trade name: Nocrac CD),
p,p-toluenesulfonylaminodiphenylamine (trade name: Nocrac TD),
N-phenyl-N'-(3-methacryloxy-2-hydroxypropyl)-p-phenylene-diamine (trade name: Nocrac G1),
N-(1-methylheptyl)-N'-phenyl-p-phenylenediamine (trade name: Ozonon 35),
N,N'-di-sec-butyl-p-phenylenediamine (trade name: Sumilizer BPA),
N-phenyl-N'-1,3-dimethylbutyl-p-phenylenediamine (trade name: Antigene 6C),
alkylated diphenylamine (trade name: Sumilizer 9A),
dimethyl-1-(2-hydroxyethyl)-4-hydroxy-2,2,6,6-tetramethyl-piperidine succinate polycondensate (trade name: Tinuvin 622LD),
poly[[6-(1,1,3,3-tetramethylbutyl)amino]-1,3,5-triazine-2,4-diyl][(2,2,6,6-tetramethyl-4-piperidyl)imino]hexamethylene-[(2,2,6,6-tetramethyl-4-piperidyl)imino]] (trade name: CHIMASSORB 944),
N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL),
bis(1-octyloxy-2,2,6,6-tetramethyl-4-piperidyl)sebacate (trade name: Tinuvin 123),
bis(2,2,6,6-tetramethyl-4-piperidyl)sebacate (trade name: Tinuvin 770),
bis(1,2,2,6,6-pentamethyl-4-piperidyl) 2-(3,5-di-t-butyl-4-hydroxybenzyl)-2-n-butylmalonate (trade name: Tinuvin 144),
bis(1,2,2,6,6-pentamethyl-4-piperidyl)sebacate (trade name: Tinuvin 765),
tetrakis(1,2,2,6,6-pentamethyl-4-piperidyl) 1,2,3,4-butanetetracarboxylate (trade name: LA-57),
tetrakis(2,2,6,6-tetramethyl-4-piperidyl) 1,2,3,4-butanetetracarboxylate (trade name: LA-52),
an esterified mixture of 1,2,3,4-butanetetracarboxylic acid with 1,2,2,6,6-pentamethyl-4-piperidinol and 1-tridecanol (trade name: LA-62),
an esterified mixture of 1,2,3,4-butanetetracarboxylic acid with 2,2,6,6-tetramethyl-4-piperidinol and 1-tridecanol (trade name: LA-67),
an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]-undecane (trade name: LA-63P),
an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (trade name: LA-68LD),
(2,2,6,6-tetramethylene-4-piperidyl)-2-propylene carboxylate (trade name: Adeka Stab LA-82),
(1,2,2,6,6-pentamethyl-4-piperidyl)-2-propylene carboxylate (trade name: Adeka Stab LA-87), etc.

Organophosphorus Compounds:
Although the organophosphorus compounds used herein are not particularly limited, the organophosphorus compounds listed below are preferred.
bis(2,4-di-t-butylphenyl)[1,1-biphenyl]-4,4'-diyl bisphosphite,
9,10-dihydro-9-oxa-10-phosphaphenanthrene-10-oxide (trade name: Sanko HCA),
triethyl phosphite (trade name: JP302),
tri-n-butyl phosphite (trade name: 304),
triphenyl phosphite (trade name: Adeka Stab TPP),
diphenyl monooctyl phosphite (trade name: Adeka Stab C),
tri(p-cresyl) phosphite (trade name: Chelex-PC),
diphenyl monodecyl phosphite (trade name: Adeka Stab 135A),
diphenyl mono(tridecyl) phosphite (trade name: JPM313),
tris(2-ethylhexyl) phosphite (trade name: JP308),
phenyl didecyl phosphite (trade name: Adeka Stab 517),
tridecyl phosphite (trade name: Adeka Stab 3010),
tetraphenyl dipropylene glycol diphosphite (trade name: JPP100),
bis(2,4-di-t-butylphenyl) pentaerythritol diphosphite (trade name: Adeka Stab PEP-24G),
tris(tridecyl) phosphite (trade name: JP333E),
bis(nonylphenyl) pentaerythritol diphosphite (trade name: Adeka Stab PEP-4C),
bis(2,6-di-t-butyl-4-methylphenyl) pentaerythritol diphosphite (trade name: Adeka Stab PEP-36), bis[2,4-di(1-phenylisopropyl)phenyl] pentaerythritol diphosphite (trade name: Adeka Stab PEP-45),
trilauryl trithiophosphite (trade name: JPS312),
tris(2,4-di-t-butylphenyl) phosphite (trade name: IRGAFOS 168),
tris(nonylphenyl) phosphite (trade name: Adeka Stab 1178),
distearyl pentaerythritol diphosphite (trade name: Adeka Stab PEP-8),
tris(mono, dinonylphenyl) phosphite (trade name: Adeka Stab 329K),
trioleyl phosphite (trade name: Chelex-OL),
tristearyl phosphite (trade name: JP318E),
4,4'-butylidene bis(3-methyl-6-t-butylphenylditridecyl) phosphite (trade name: JPH1200),
tetra(mixed $C_{12}$-$C_{15}$ alkyl)-4,4'-isopropylidene diphenyl diphosphite (trade name: Adeka Stab 1500),
tetra(tridecyl)-4,4'-butylidene bis(3-methyl-6-t-butylphenyl) diphosphite (trade name: Adeka Stab 260),
hexa(tridecyl)-1,1,3-tris(2-methyl-5-t-butyl-4-hydroxy-phenyl)butane triphosphite (trade name: Adeka Stab 522A),
hydrogenated bisphenol A phosphite polymer (HBP),
tetrakis(2,4-di-t-butylphenyloxy)-4,4'-biphenylene diphosphine (trade name: P-EPQ),
tetrakis(2,4-di-t-butyl-5-methylphenyloxy) 4,4'-biphenylene diphosphine (trade name: GSY-101P),
2-[[2,4,8,10-tetrakis(1,1-dimethylethyl)dibenzo[d,f][1,3,2]-dioxaphosphepin-6-yl]oxy]-N,N-bis[2-[[2,4,8,10-tetrakis (1,1-dimethylethyl)dibenzo[d,f][1,3,2]dioxaphosphepin-6-yl]oxy]-ethyl]ethanamine (trade name: IRGAFOS 12),
2,2'-methylenebis(4,6-di-t-butylphenyl)octyl phosphite (trade name: Adeka Stab HP-10), etc.

Organosulfur Compounds:

Although the organosulfur compounds used herein are not particularly limited, the organosulfur compounds listed below are preferred.
dilauryl 3,3'-thiodipropionate (trade name: Sumilizer TPL-R),
dimyristyl 3,3'-thiodipropionate (trade name: Sumilizer TPM),
distearyl 3,3'-thiodipropionate (trade name: Sumilizer TPS),
pentaerythritol tetrakis(3-laurylthiopropionate) (trade name: Sumilizer TP-D),
ditridecyl 3,3'-thiodipropionate (trade name: Sumilizer TL),
2-mercaptobenzimidazole (trade name: Sumilizer MB),
ditridecyl 3,3'-thiodipropionate (trade name: Adeka Stab AO-503A),
1,3,5-tris-β-stearylthiopropionyloxyethyl isocyanurate,
didodecyl 3,3'-thiodipropionate (trade name: IRGANOX PS 800FL),
dioctadecyl 3,3'-thiodipropionate (trade name: IRGANOX PS 802FL), etc.

Of the foregoing antioxidants, Adeka Stab AO-60, IRGANOX 1076, IRGANOX 1135, and IRGANOX 1520L (all trade names) are preferred in consideration of compatibility with the non-aromatic saturated monovalent hydrocarbon group-containing organopolysiloxane as component (A), component (B), and an organic solvent to be described later.

An appropriate amount of component (E) added is 0.1 to 5 parts by weight, preferably 0.2 to 3 parts by weight per 100 parts by weight of component (A). Outside the range, less amounts may fail to exert the desired effect whereas larger amounts may become less compatible.

Notably component (E) is not limited to one type and a mixture of two or more types may be used.

In addition to components (A), (B), (C), (D), and (E), the inventive composition may further contain (F) an organic solvent.

In the adhesive composition of the invention wherein the non-aromatic saturated monovalent hydrocarbon group-containing organopolysiloxane (A-1) or the higher molecular weight organopolysiloxane (A-2) may be used as the organopolysiloxane (A), component (F) is preferably a solvent which can dissolve components (A), (B), (C), (D), and (E) and form a thin film with a thickness of 1 to 200 μm by well-known thin film forming techniques such as spin coating. The more preferred film thickness is 5 to 180 μm, and even more preferably 30 to 150 μm, and an organic solvent which can form a thin film with a thickness in such range is preferred as component (F).

As the organic solvent (F) for dissolving components (A), (B), (C), (D), and (E), those solvents other than ketone, ester and alcohol solvents may be used. Although the adhesive composition of the invention can be dissolved in ether solvents, non-aromatic hydrocarbons are preferred when working and safety factors (e.g., odor) of the solvent are taken into account.

Typical of the organic solvent (F) are non-aromatic hydrocarbon compounds of 4 to 15 carbon atoms, examples of which include pentane, hexane, cyclopentane, cyclohexane, methylcyclohexane, octane, isooctane, isononane, decane, undecane, isododecane, limonene, and pinene.

Of these, those hydrocarbon solvents having a boiling point of 120 to 240° C. are preferred as the organic solvent (F) which affords a spin-coatable, fully safe adhesive composition. Specifically, isononane, decane, isodecane, dodecane, and isododecane are preferred from this aspect. A boiling point of at least 120° C. is preferred because of a slow volatilization rate and ease of spin coating. A boiling point of not higher than 240° C. is preferred because the hydrocarbon solvent is readily volatilized off upon heat drying after coating and little thereof remains in the film, and so, even when the adhesive composition is exposed to high temperature in a heating step after substrate bonding, formation of bubbles at the interface is prevented.

An appropriate amount of component (F) added is 10 to 1,000 parts by weight, preferably 20 to 200 parts by weight per 100 parts by weight of components (A) and (B). If the amount is less than the range, the adhesive composition has too high a viscosity to coat to a wafer. If the amount is larger than the range, a sufficient film thickness is not obtained after coating.

Notably component (F) is not limited to one type and a mixture of two or more types may be used.

[Other Components]

Besides the aforementioned components, any of components which are used in conventional adhesive compositions may be added to the adhesive composition of the invention as long as the benefits of the invention are not impaired.

For example, well-known surfactants may be added to the adhesive composition for facilitating coating operation. Suitable surfactants include, but are not limited to, nonionic surfactants, for example, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene polyoxypropylene block copolymers; sorbitan fatty acid esters such as sorbitan monolaurate, sorbitan monopalmitate and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172, F173 (DIC Corp.), Fluorad FC430 and FC431 (3M-Sumitomo Co., Ltd.), Asahiguard AG710, Surflon S-381, S-382, SC101, SC102, SC103, SC104, SC105, SC106, Surfynol E1004, KH-10, KH-20, KH-30, and KH-40 (Asahi Glass Co., Ltd.); organosiloxane polymers KP341, X-70-092, X-70-093 (Shin-Etsu Chemical Co., Ltd.), acrylic acid or methacrylic acid Polyflow No. 75, No. 95 (Kyoeisha Ushi Kagaku Kogyo Co., Ltd.). These surfactants may be used alone or in a combination of two or more.

To the adhesive composition of the invention, any well-known adhesive aids which are not reactive with substrates such as silicon wafers and glass substrates, for example, silane coupling agents may be added for further enhancing the adhesion of the composition.

The silicone adhesive composition thus constructed has advantages of low manufacture cost and high productivity because exposure, bake and development steps are unnecessary for the manufacture process, has satisfactory properties needed as adhesive including adhesion, hermetic seal after heat curing, and low hygroscopicity, and forms a cured film with high reliability in terms of heat resistance and light resistance, and can reduce the warpage of bonded substrate after back grinding as required in the 3D package manufacture.

Described below is the method of bonding a silicon wafer to a glass substrate using the adhesive composition in the process for the manufacture of CCD and CMOS image sensors.

First, the adhesive composition is applied onto a substrate. The substrate used herein is, for example, a solid-state imaging device-forming silicon wafer.

The coating step may be performed by any well-known lithography techniques. For example, any of dipping, spin coating and roll coating techniques may be used for coating.

At this point, prebake may be performed to previously volatilize off the solvent or the like for the purpose of mitigating outgassing during the step of bonding to a protective glass substrate. Prebake may be at 40 to 100° C., for example.

The adhesive composition-bearing silicon substrate (solid-state imaging device-forming silicon wafer) thus obtained may be temporarily bonded to a protective glass substrate, using a bonding machine. Temporary bonding conditions include a bonding temperature of preferably 50 to 200° C., more preferably 70 to 150° C., a holding time (prior to bonding) of preferably 0 to 10 minutes, more preferably 1 to 5 minutes, and a reduced pressure (during bonding) of preferably up to 100 mbar, more preferably up to 10 mbar. A temporary bond may be established under a bonding pressure of 0.1 to 50 kN, more preferably 0.5 to 20 kN. If necessary, the temporary bonded substrates may be heated to cure the composition. Heat curing may be conducted at a temperature of preferably 100 to 220° C., more preferably 120 to 200° C. for a time of preferably 1 to 60 minutes, more preferably 3 to 30 minutes.

Accordingly, a solid-state imaging device including a laminate for use in CCD or CMOS is obtained, the laminate comprising a substrate selected from among a silicon wafer, solid-state imaging device silicon wafer, plastic substrate, ceramic substrate, and metallic circuit substrate, a layer of the inventive adhesive composition formed on the substrate, and a protective glass substrate disposed on the layer. It is noted that the device may be prepared either by forming a layer of the adhesive composition on a substrate such as silicon wafer and stacking a protective glass substrate thereon, or by forming a layer of the adhesive composition on a protective glass substrate and stacking a substrate such as silicon wafer thereon.

EXAMPLES

Synthesis Examples, Comparative Synthesis Examples, Examples, Comparative Examples are given below for further illustrating the invention although the invention is not limited thereto. It is noted that in Examples, Me stands for methyl, the viscosity is a measurement at 25° C. by a rotational viscometer, and the weight average molecular weight is a value determined by GPC versus polystyrene standards.

Synthesis of Organopolysiloxanes

Synthesis Example 1

A 1-L flask equipped with a stirrer, condenser and thermometer was charged with 234 g (13 moles) of water and 35 g of toluene and heated at 80° C. in an oil bath. A dropping funnel was charged with 108.8 g (0.5 mole) of cyclohexyltrichlorosilane, 65.9 g (0.3 mole) of n-hexyltrichlorosilane, 6.5 g (0.05 mole) of dimethyldichlorosilane, 7.1 g (0.05 mole) of methylvinyldichlorosilane, and 10.9 g (0.1 mole) of trimethylchlorosilane, which was added dropwise to the flask over 1 hour while stirring. After the completion of dropwise addition, stirring was continued at 80° C. for 1 hour for ripening. The solution was cooled to room temperature while it was kept static. The separated water phase was removed. Subsequently, the procedure of combining the toluene phase with 10 wt % sodium sulfate aqueous solution, stirring for 10 minutes, keeping static for 30 minutes, and removing the separated water phase was repeated until the toluene phase became neutral, whereby the reaction was stopped. After the flask was equipped with an ester adaptor, the organopolysiloxane-containing toluene phase was heated under reflux to remove water from the toluene phase. After the internal temperature reached 110° C., heating under reflux was continued for a further 1 hour. The solution was cooled to room temperature. The resulting organopolysiloxane solution was filtered to remove the insoluble matter. Subsequent distillation under reduced pressure to remove toluene yielded 115.2 g of an organopolysiloxane (A-I) in solid form.

The resulting organopolysiloxane (A-I) consisted of 80 mol % of T units, 10 mol % of D units, and 10 mol % of M units, and contained at ends 0.09 mole of silanol groups and 0.043 mole of vinyl groups per 100 g of organopolysiloxane (A-I). It looked to be a colorless transparent solid and had a weight average molecular weight of 7,500. It had a cyclohexyl content of 38 mol %, a n-hexyl content of 23 mol %, and a vinyl content of 3.8 mol % based on the overall organic groups. Cyclohexyl, n-hexyl, methyl, and vinyl groups accounted for 50 mol %, 30 mol %, 15 mol %, and 5 mol % of the overall organic groups represented by $R^1$ to $R^3$, respectively.

Synthesis Example 2-1

Synthesis was carried out as in Synthesis Example 1 except that a 2-L flask was charged with 468 g (26 moles) of water and 70 g of toluene and heated at 80° C. in an oil bath, and a dropping funnel was charged with 275.6 g (1.2 moles) of norbornyltrichlorosilane, 65.8 g (0.3 mole) of n-hexyltrichlorosilane, 25.8 g (0.2 mole) of dimethyldichlorosilane, 14.2 g (0.1 mole) of methylvinyldichlorosilane, and 21.8 g (0.2 mole) of trimethylchlorosilane. There was obtained 228.8 g of an organopolysiloxane in solid form.

The resulting organopolysiloxane consisted of 75 mol % of T units, 15 mol % of D units, and 10 mol % of M units, and contained 0.07 mole of silanol groups and 0.039 mole of vinyl groups per 100 g. It looked to be a colorless transparent solid and had a weight average molecular weight of 9,300. It had a norbornyl content of 44 mol %, a n-hexyl content of 11 mol %, and a vinyl content of 3.7 mol % based on the overall organic groups. Norbornyl, n-hexyl, methyl and vinyl groups accounted for 57 mol %, 14 mol %, 24 mol %, and 5 mol % of the overall organic groups represented by $R^1$ to $R^3$, respectively.

Synthesis Example 2-2

The solid organopolysiloxane obtained in Synthesis Example 2-1, 100 g, was dissolved as the alkenyl-containing organopolysiloxane in 100 g of toluene to form a solution having a solid concentration of 50 wt %. To this solution, a platinum-based catalyst was added to provide 20 ppm of platinum atom based on the resin. After the solution was heated at 60° C., 44.6 g of a compound (SiH equivalent 2,287 g/mol) having the formula (4) shown below, which amount corresponded to a H/Vi ratio (a ratio of SiR groups to total alkenyl groups) of 0.5, as the hydrosilyl-containing compound was added dropwise, during which an exotherm due to reaction was observed. Reaction was continued at 100° C. for 2 hours to completion. By carrying out distillation under reduced pressure for concentrating and distilling off toluene, the reaction product was solidified, obtaining an organopolysiloxane (A-II). The resin had a weight average molecular weight (Mw) of 41,000 as measured by GPC and contained 0.019 mol of vinyl groups per 100 g.

[Chemical Formula 7]

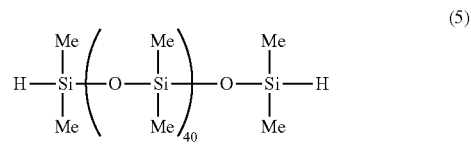

(4)

Synthesis Example 3-1

Synthesis was carried out as in Synthesis Example 1 except that a 1-L flask was charged with 234 g (13 moles) of water and 35 g of toluene and heated at 80° C. in an oil bath, and a dropping funnel was charged with 160.7 g (0.7 mole) of norbornyltrichlorosilane, 45.6 g (0.15 mole) of n-dodecyltrichlorosilane, 7.1 g (0.05 mole) of methylvinyldichlorosilane, and 10.9 g (0.1 mole) of trimethylchlorosilane. There was obtained 143.8 g of an organopolysiloxane in solid form.

The resulting organopolysiloxane consisted of 85 mol % of T units, 5 mol % of D units, and 10 mol % of M units, and contained 0.1 mole of silanol groups and 0.034 mole of vinyl groups per 100 g. It looked to be a colorless transparent solid and had a weight average molecular weight of 6,100. It had a norbornyl content of 56 mol %, a n-dodecyl content of 12 mol %, and a vinyl content of 4.0 mol % based on the overall organic groups. Norbornyl, n-dodecyl, methyl and vinyl groups accounted for 74 mol %, 16 mol %, 5 mol %, and 5 mol % of the overall organic groups represented by $R^1$ to $R^3$, respectively.

Synthesis Example 3-2

Reaction was conducted as in Synthesis Example 2-2 except that 100 g of the solid organopolysiloxane obtained in Synthesis Example 3-1 was used as the alkenyl-containing organopolysiloxane, and 31.6 g of a compound (SiH equivalent 1,547 g/mol) having the formula (5) shown below, which amount corresponded to a H/Vi ratio of 0.6, was used as the hydrosilyl-containing compound. There was obtained an organopolysiloxane (A-III) having a weight average molecular weight of 46,400. The resin contained 0.02 mol of vinyl groups per 100 g.

[Chemical Formula 8]

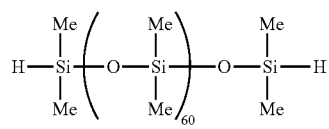

(5)

Comparative Synthesis Example 1

Synthesis was carried out as in Synthesis Example 1 except that a 1-L flask was charged with 234 g (13 moles) of water and 35 g of toluene and heated at 80° C. in an oil bath, and a dropping funnel was charged with 137.5 g (0.65 mole) of phenyltrichlorosilane, 50.6 g (0.2 mole) of diphenyldichlorosilane, 7.1 g (0.05 mole) of methylvinyldichlorosilane, and 10.8 g (0.1 mole) of trimethylchlorosilane. There was obtained 137 g of an organopolysiloxane (A-IV) in solid form.

The resulting organopolysiloxane (A-IV) consisted of 65 mol % of T units, 25 mol % of D units, and 10 mol % of M units, and contained at ends 0.01 mole of silanol groups and 0.034 mole of vinyl groups per 100 g of the organopolysiloxane. It looked to be a colorless transparent solid and had a weight average molecular weight of 11,700. Phenyl (aromatic unsaturated hydrocarbon), methyl, and vinyl groups accounted for 92 mol %, 4 mol %, and 4 mol % of the overall organic groups represented by $R^1$ to $R^3$, respectively.

Comparative Synthesis Example 2

Synthesis was carried out as in Synthesis Example 1 except that a 1-L flask was charged with 234 g (13 moles) of water and 35 g of toluene and heated at 80° C. in an oil bath, and a dropping funnel was charged with 91.8 g (0.4 mole) of norbornyltrichlorosilane, 24.7 g (0.15 mole) of n-hexyltrichlorosilane, 45.2 g (0.35 mole) of dimethyldichlorosilane, 7.1 g (0.05 mole) of methylvinyldichlorosilane, and 5.4 g (0.05 mole) of trimethylchlorosilane. There was obtained 143.8 g of an organopolysiloxane (A-V) in solid form.

The resulting organopolysiloxane consisted of 55 mol % of T units, 40 mol % of D units, and 5 mol % of M units, and contained 0.12 mole of silanol groups and 0.044 mole of vinyl groups per 100 g. It looked to be a colorless transparent solid and had a weight average molecular weight of 10,500.

It had a norbornyl content of 27 mol %, a n-hexyl content of 10 mol %, and a vinyl content of 3.3 mol % based on the overall organic groups. Norbornyl, n-hexyl, methyl, and vinyl groups accounted for 30 mol %, 11 mol %, 55 mol %, and 4 mol % of the overall organic groups represented by $R^1$ to $R^3$, respectively.

Examples 1 to 3 & Comparative Examples 1, 2

The above organopolysiloxane A-I, A-II or A-III or comparative organopolysiloxane A-IV or A-V was used as component (A), and components (B), (C), (D), (E) and (F) were added according to the formulation shown in Table 1, followed by stirring, mixing and dissolution. The following compound (B-I) or (B-II) was used as component (B).

[Chemical Formula 9]

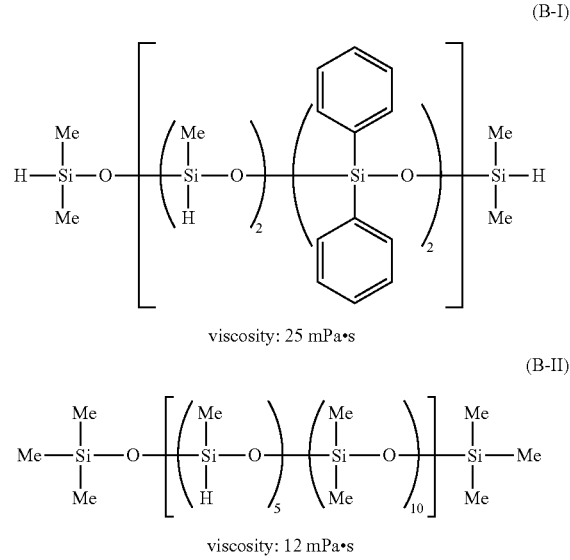

There were also used a platinum catalyst CAT-PL-50T (Shin-Etsu Chemical Co., Ltd.) as component (C), ethynyl cyclohexanol as component (D), a phenol based antioxidant Adeka Stab AO-60 as component (E), and isononane as component (F). The compositions were precision filtered through a Teflon® filter having a size of 0.2 μm, obtaining inventive adhesive compositions of Examples 1 to 3 and adhesive compositions of Comparative Examples 1 and 2.

Using a spin coater, each of the adhesive compositions of Examples 1 to 3 and Comparative Examples 1 and 2 in Table 1 was coated on a 8-inch silicon wafer to the thickness shown in Table 1. The coating was prebaked on a hot plate at 80° C. for 5 minutes to remove the solvent. Using a bonding machine, the 8-inch silicon wafer coated with the adhesive composition was temporarily bonded under conditions including a bonding temperature of 100° C., a holding time (prior to bonding) of 1 minute, a reduced pressure (during bonding) of $4 \times 10^3$ mbar, and a bonding pressure of 2 kN. The temporary bonded substrate was heat cured at 150° C. for 5 minutes, yielding a final bonded substrate.

Various tests were carried out by the following methods.
[Adhesion Test]

Bonding of a 8-inch wafer was carried out using a wafer bonding system 520IS of EVG. After bonding and cooling to room temperature, the bonded interface was visually observed. The rating is good (○) when no anomalies are detected at the interface or poor (x) when anomalies like bubbles are detected.
[Back Grinding Resistance Test]

Using a grinder DAG810 of Disco Corp., the back surface of the silicon substrate was ground. After grinding to a final thickness of 50 μm, the substrate was observed under an optical microscope to inspect anomalies such as cracks and peels. The rating is good (○) when no anomalies are detected or poor (x) when anomalies are detected.
[Heat Resistance]

The bonded assembly after back grinding of the silicon substrate was heated on a hot plate at 230° C. or 260° C. for 3 minutes in air, before the outer appearance was inspected for anomalies. The rating is good (○) when no appearance anomalies are detected or poor (x) when appearance anomalies or peels are detected.
[Light Resistance]

For examining light resistance, the following short-term and long-term light resistance tests were carried out.

In the short-term light resistance test, the adhesive composition was spin coated on a glass substrate to a film thickness of 500 μm, and heat cured at 150° C. for 10 minutes, whereupon an initial transmittance (wavelength 400 nm) was measured. Next, it was heated on a hot plate at 230° C. or 260° C. for 3 minutes in air, whereupon a transmittance (wavelength 400 nm) after heating was measured again. A percent attenuation was computed as [(transmittance @400 nm after heating)/(initial transmittance @400 nm)]×100. The rating is good (○) for an attenuation of at least 90% or poor (x) for an attenuation of less than 90%.

In the long-term light resistance test, the adhesive composition was spin coated on a glass substrate to a film thickness of 500 μm, and heat cured at 150° C. for 10 minutes, whereupon an initial transmittance (wavelength 400 nm) was measured. Next, it was exposed to simulative sunlight (with wavelength 350 nm and shorter cut off) at 5,000,000 lux, whereupon a transmittance (wavelength 400 nm) after light exposure was measured again. A percent attenuation was computed as [(transmittance @400 nm after light exposure)/(initial transmittance @400 nm)]×100. The rating is good (○) for an attenuation of at least 90% or poor (x) for an attenuation of less than 90%.
[Warpage (Warpage of Bonded Wafer)]

Using a back polishing machine, an assembly obtained by bonding and heat curing a 8-inch silicon wafer substrate and a protective glass substrate using the adhesive composition was polished on the silicon side from an initial thickness of 725 μm to a thickness of 100 μm. After back polishing, the bonded 8-inch wafer was measured for warpage.

The test results are shown in Table 1.

TABLE 1

| (pbw) | Example 1 | Example 2 | Example 3 | Comparative Example 1 | Comparative Example 2 |
|---|---|---|---|---|---|
| Component (A) | A-I (100) | A-II (100) | A-III (100) | A-IV (100) | A-V (100) |

TABLE 1-continued

| (pbw) | | Example 1 | Example 2 | Example 3 | Comparative Example 1 | Comparative Example 2 |
|---|---|---|---|---|---|---|
| Component (B) | | B-I (15) | B-I (6.5) | B-II (9) | B-I (12) | B-II (20) |
| Component (C) | | CAT-PL-50T (0.5) | CAT-PL-50T (0.5) | CAT-PL-50T (0.5) | CAT-PL-50T (0.5) | CAT-PL-50T (0.5) |
| Component (D) | | ethynyl cyclo-hexanol (0.1) | ethynyl cyclo-hexanol (0.1) | ethynyl cyclo-hexanol (0.1) | ethynyl cyclo-hexanol (0.1) | ethynyl cyclo-hexanol (0.1) |
| Component (E) | | Adeka Stab AO-60 (1) | Adeka Stab AO-60 (1) | Adeka Stab AO-60 (1) | Adeka Stab AO-60 (1) | Adeka Stab AO-60 (1) |
| Component (F) | | isononane (45) | isononane (50) | isononane (50) | isononane (45) | isononane (45) |
| molar ratio of SiH groups in component (B) to alkenyl groups in component (A) | | 2.1 | 2.2 | 1.9 | 2.2 | 1.9 |
| Film thickness (μm) | | 30 | 30 | 30 | 30 | 30 |
| Test results | Adhesion | ○ | ○ | ○ | ○ | ○ |
| | Back grinding resistance | ○ | ○ | ○ | ○ | ○ |
| | Heat resistance 230° C. | ○ | ○ | ○ | ○ | ○ |
| | Heat resistance 260° C. | ○ | ○ | ○ | ○ | x |
| | Short-term light resistance | ○ | ○ | ○ | x | ○ |
| | Long-term light resistance | ○ | ○ | ○ | x | ○ |
| | Warpage (μm) | 11.3 | 8.9 | 7.7 | 51.1 | 5.2 |

It is seen from Table 1 that on use of a norbornyl-free phenyl silicone resin as in Comparative Example 1, light resistance and warpage are exacerbated, and on use of a resin with a low norbornyl content as in Comparative Example 2, warpage is good, but heat resistance is degraded. In contrast, all Examples 1 to 3 are excellent in heat resistance, light resistance and warpage. That is, the adhesive composition of the invention meets the aforementioned requirements.

It has been demonstrated that the silicone adhesive composition of the invention has advantages of low manufacture cost and high productivity because exposure, bake and development steps are unnecessary for the manufacture process, has satisfactory properties needed as adhesive including adhesion, hermetic seal after heat curing, and low hygroscopicity, and forms a cured film with high reliability in terms of heat resistance and light resistance, and can reduce the warpage of bonded substrate after back grinding as required in the 3D package manufacture.

It is noted that the invention is not limited to the aforementioned embodiments. While the embodiments are merely exemplary, any embodiments having substantially the same construction as the technical concept set forth in the following claims and achieving equivalent functions and results are believed to be within the spirit and scope of the invention.

The invention claimed is:

1. A silicone adhesive composition comprising
   (A) an organopolysiloxane containing a non-aromatic saturated monovalent hydrocarbon group and an alkenyl group, wherein said organopolysiloxane (A) is
   (A-1) an organopolysiloxane comprising the following units (I) to (III) and having a weight average molecular weight of 2,000 to 60,000, or
   (A-2) an organopolysiloxane having a weight average molecular weight of 20,000 to 400,000, obtained from hydrosilylation reaction of the organopolysiloxane (A-1) with at least one organohydrogenpolysiloxane having the general formula (1) in such amounts that a molar ratio of total SiH groups in the organohydrogenpolysiloxane to total alkenyl groups in the organopolysiloxane (A-1) may be in a range of 0.4/1 to 0.8/1, to achieve a molecular weight buildup,
   (I) 50 to 99 mol % of siloxane units (T units) of the formula: $R^1SiO_{3/2}$,
   (II) 0 to 49 mol % of siloxane units (D units) of the formula: $R^2R^3SiO_{2/2}$, and
   (III) 1 to 15 mol % of siloxane units (M units) of the formula: $R^4_3SiO_{1/2}$, wherein $R^1$ to $R^3$ each are a monovalent organic group, 2 to 10 mol % of the overall organic groups represented by $R^1$ to $R^3$ are alkenyl groups of 2 to 7 carbon atoms, at least 40 mol % of the overall organic groups represented by $R^1$ to $R^3$, which may be the same or different, are non-aromatic saturated monovalent hydrocarbon groups of 5 to 10 carbon atoms containing any one of the following cyclic structures:

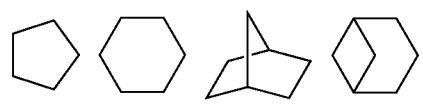

and 10 to 40 mol % of the overall organic groups represented by $R^1$ to $R^3$, which may be the same or different, are substituted or unsubstituted, acyclic saturated monovalent hydrocarbon groups of 6 to 15 carbon atoms, and the balance being organic groups other than the alkenyl groups, the non-aromatic saturated monovalent hydrocarbon groups of 5 to 10 carbon atoms, and the acyclic saturated monovalent hydrocarbon groups of 6 to 15 carbon atoms, and $R^4$ may be the same or different and is a substituted or unsubstituted monovalent hydrocarbon group of 1 to 7 carbon atoms,

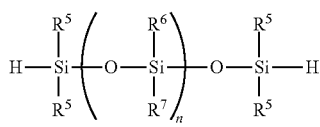

wherein $R^5$ to $R^7$ may be the same or different and are monovalent hydrocarbon groups of 1 to 12 carbon atoms, exclusive of alkenyl, and n is an integer of 0 to 200;
(B) an organohydrogenpolysiloxane containing at least two SiH groups per molecule in such an amount that a molar ratio of SiH groups in component (B) to alkenyl groups in component (A) may be in a range of 0.5/1 to 10/1;
(C) an effective amount of a platinum-based catalyst; and
(D) a reaction inhibitor.

2. The adhesive composition of claim 1, further comprising (E) an antioxidant.

3. The adhesive composition of claim 1, further comprising (F) an organic solvent.

4. The adhesive composition of claim 3 wherein the organic solvent (F) is a hydrocarbon solvent having a boiling point of 120 to 240° C.

5. A silicone adhesive composition comprising
(A) an organopolysiloxane containing a non-aromatic saturated monovalent hydrocarbon group and an alkenyl group, wherein said organopolysiloxane (A) is
(A-1) an organopolysiloxane comprising the following units (I) to (III) and having a weight average molecular weight of 2,000 to 60,000, or
(A-2) an organopolysiloxane having a weight average molecular weight of 20,000 to 400,000, obtained from hydrosilylation reaction of the organopolysiloxane (A-1) with at least one organohydrogenpolysiloxane having the general formula (1) in such amounts that a molar ratio of total SiH groups in the organohydrogenpolysiloxane to total alkenyl groups in the organopolysiloxane (A-1) may be in a range of 0.4/1 to 0.8/1, to achieve a molecular weight buildup,
(I) 50 to 99 mol % of siloxane units (T units) of the formula: $R^1SiO_{3/2}$,
(II) 0 to 49 mol % of siloxane units (D units) of the formula: $R^2R^3SiO_{2/2}$, and
(III) 1 to 15 mol % of siloxane units (M units) of the formula: $R^4{}_3SiO_{1/2}$,
wherein $R^1$ to $R^3$ each are a monovalent organic group, 2 to 10 mol % of the overall organic groups represented by $R^1$ to $R^3$ are alkenyl groups of 2 to 7 carbon atoms, at least 40 mol % of the overall organic groups represented by $R^1$ to $R^3$, which may be the same or different, are non-aromatic saturated monovalent hydrocarbon groups of 5 to 10 carbon atoms containing any one of the following cyclic structures:

and 10 to 40 mol % of the overall organic groups represented by $R^1$ to $R^3$, which may be the same or different, are substituted or unsubstituted, acyclic saturated monovalent hydrocarbon groups of 6 to 15 carbon atoms, and the balance being organic groups other than the alkenyl groups, the non-aromatic saturated monovalent hydrocarbon groups of 5 to 10 carbon atoms, and the acyclic saturated monovalent hydrocarbon groups of 6 to 15 carbon atoms, and $R^4$ may be the same or different and is a substituted or unsubstituted monovalent hydrocarbon group of 1 to 7 carbon atoms

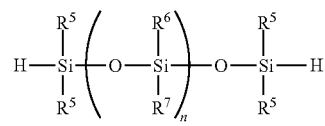

wherein $R^5$ to $R^7$ may be the same or different and are monovalent hydrocarbon groups of 1 to 12 carbon atoms, exclusive of alkenyl, and n is an integer of 0 to 200;
(B) an organohydrogenpolysiloxane containing at least two SiH groups per molecule in such an amount that a molar ratio of SiH groups in component (B) to alkenyl groups in component (A) may be in a range of 0.5/1 to 10/1; and
(C) an effective amount of a platinum-based catalyst,
which adhesive composition is sandwiched between a protective glass substrate and a substrate which is selected from the group consisting of a silicon wafer, solid-state imaging device silicon wafer, plastic substrate, ceramic substrate, and metallic circuit substrate.

6. A solid-state imaging device comprising a laminate including a substrate which is selected from the group consisting of a silicon wafer, solid-state imaging device silicon wafer, plastic substrate, ceramic substrate, and metallic circuit substrate, on which
a cured layer of a silicone adhesive composition comprising
(A) an organopolysiloxane containing a non-aromatic saturated monovalent hydrocarbon group and an alkenyl group, wherein said organopolysiloxane (A) is
(A-1) an organopolysiloxane comprising the following units (I) to (III) and having a weight average molecular weight of 2,000 to 60,000, or
(A-2) an organopolysiloxane having a weight average molecular weight of 20,000 to 400,000, obtained from hydrosilylation reaction of the organopolysiloxane (A-1) with at least one organohydrogenpolysiloxane having the general formula (1) in such amounts that a molar ratio of total SiH groups in the organohydrogenpolysiloxane to total alkenyl groups in the organopolysiloxane (A-1) may be in a range of 0.4/1 to 0.8/1, to achieve a molecular weight buildup,
(I) 50 to 99 mol % of siloxane units (T units) of the formula: $R^1SiO_{3/2}$,
(II) 0 to 49 mol % of siloxane units (D units) of the formula: $R^2R^3SiO_{2/2}$, and
(III) 1 to 15 mol % of siloxane units (M units) of the formula: $R^4{}_3SiO_{1/2}$,
wherein $R^1$ to $R^3$ each are a monovalent organic group, 2 to 10 mol % of the overall organic groups represented by $R^1$ to $R^3$ are alkenyl groups of 2 to 7 carbon atoms, at least 40 mol % of the overall organic groups represented by $R^1$ to $R^3$, which may be the same or different, are non-aromatic saturated monovalent hydrocarbon groups of 5 to 10 carbon atoms containing any one of the following cyclic structures:

and 10 to 40 mol % of the overall organic groups represented by $R^1$ to $R^3$, which may be the same or different, are substituted or unsubstituted, acyclic saturated monovalent hydrocarbon groups of 6 to 15 carbon atoms, and the balance being organic groups other than the alkenyl groups, the non-aromatic saturated monovalent hydrocarbon groups of 5 to 10 carbon atoms, and the acyclic saturated monovalent hydrocarbon groups of 6 to 15 carbon atoms, and $R^4$ may be the same or different and is a substituted or unsubstituted monovalent hydrocarbon group of 1 to 7 carbon atoms

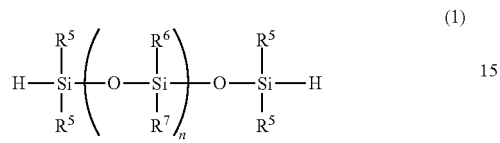

(1)

wherein $R^5$ to $R^7$ may be the same or different and are monovalent hydrocarbon groups of 1 to 12 carbon atoms, exclusive of alkenyl, and n is an integer of 0 to 200;

(B) an organohydrogenpolysiloxane containing at least two SiH groups per molecule in such an amount that a molar ratio of SiH groups in component (B) to alkenyl groups in component (A) may be in a range of 0.5/1 to 10/1;

(C) an effective amount of a platinum-based catalyst and a protective glass substrate are stacked in order.

\* \* \* \* \*